United States Patent
Lee et al.

(10) Patent No.: US 9,189,174 B2
(45) Date of Patent: Nov. 17, 2015

(54) NONVOLATILE MEMORY DEVICE AND METHOD OF OPERATING THE SAME

(71) Applicant: SAMSUNG ELECTRONICS CO., LTD., Suwon-si, Gyeonggi-do (KR)

(72) Inventors: Han-Jun Lee, Seoul (KR); Dae-Seok Byeon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 227 days.

(21) Appl. No.: 13/904,047

(22) Filed: May 29, 2013

(65) Prior Publication Data

US 2014/0032821 A1    Jan. 30, 2014

(30) Foreign Application Priority Data

Jul. 24, 2012    (KR) .................. 10-2012-0080648

(51) Int. Cl.
| | |
|---|---|
| *G11C 16/04* | (2006.01) |
| *G06F 3/06* | (2006.01) |
| *G11C 16/30* | (2006.01) |
| *G11C 16/12* | (2006.01) |
| *G11C 5/14* | (2006.01) |

(52) U.S. Cl.
CPC .............. *G06F 3/0679* (2013.01); *G06F 3/061* (2013.01); *G06F 3/0638* (2013.01); *G11C 5/145* (2013.01); *G11C 16/12* (2013.01); *G11C 16/30* (2013.01)

(58) Field of Classification Search
CPC ........... G11C 13/0069; G11C 11/5628; G11C 11/1675; G11C 13/003; G11C 16/32; G11C 16/06; G11C 16/102; G11C 16/30; G11C 5/147; G11C 11/4074; G11C 13/0038; G11C 13/0061; G11C 15/046; G11C 2013/0076
USPC ............... 365/185.19, 233.1, 233.11, 233.12, 365/189.011, 194, 195
See application file for complete search history.

(56) References Cited

U.S. PATENT DOCUMENTS

| | | | |
|---|---|---|---|
| 7,944,747 B2 | 5/2011 | Chae et al. | |
| 8,018,772 B2 | 9/2011 | Chen et al. | |
| 2004/0120204 A1* | 6/2004 | Kanda et al. | 365/225.7 |
| 2005/0024974 A1* | 2/2005 | Noguchi et al. | 365/230.03 |
| 2008/0235541 A1 | 9/2008 | Ikeda | |

(Continued)

FOREIGN PATENT DOCUMENTS

| | | |
|---|---|---|
| KR | 100596330 B1 | 6/2006 |
| KR | 100634432 | 10/2006 |

(Continued)

*Primary Examiner* — Son Dinh
*Assistant Examiner* — Uyen B Tran
(74) *Attorney, Agent, or Firm* — Volentine & Whitt, PLLC

(57) ABSTRACT

Provided are a nonvolatile memory device and a method for operating the nonvolatile memory device. The method for operating the nonvolatile memory device includes generating a first program voltage, applying the generated first program voltage to a first word line to which a first memory cell is connected for performing a first program operation on the first memory cell, determining whether a number of pulses of a pumping clock signal for generating the first program voltage is greater than or equal to a predetermined critical value n (where n is a natural number), and stopping the performing of the first program operation on the first memory cell when the number of pulses of the pumping clock signal is determined to be greater than or equal to the predetermined critical value n.

20 Claims, 10 Drawing Sheets

(56) References Cited

U.S. PATENT DOCUMENTS

2009/0207664 A1* 8/2009 Kim et al. ............... 365/185.19
2010/0254202 A1* 10/2010 Asauchi ................. 365/189.17

FOREIGN PATENT DOCUMENTS

| KR | 20090123509 A | 12/2009 |
| KR | 20110085020 A | 7/2011 |

* cited by examiner

NONVOLATILE MEMORY DEVICE AND METHOD OF OPERATING THE SAME

CROSS-REFERENCE TO RELATED APPLICATION

A claim for priority under 35 U.S.C. §119 is made to Korean Patent Application No. 10-2012-0080648 filed on Jul. 24, 2012, in the Korean Intellectual Property Office, the entire contents of which are hereby incorporated by reference.

BACKGROUND

Embodiments of the present invention relate to nonvolatile memory devices and methods for operating the same.

Generally, semiconductor memory devices are able to store data and read out the stored data, as needed. Semiconductor memory devices may be classified as nonvolatile memories which retain stored data in the absence of applied power and volatile memories which lose stored data in the absence of applied power. Examples of nonvolatile semiconductor devices include programmable read only memory (PROM), erasable and programmable read only memory (EPROM), electrically erasable and programmable read only memory (EEPROM), and flash memory. Examples of volatile memories include dynamic random access memory (DRAM) and static random access memory (SRAM).

SUMMARY

Various embodiments provide a method for operating a nonvolatile memory device that reduces program time and unnecessarily consumed power during memory cell program operations. Various embodiments also provide a nonvolatile memory device configured to reduce program time, as well as unnecessarily consumed power during memory cell program operations. These and other objects will be described in or be apparent from the following description of the preferred embodiments.

According to an embodiment, a method is provided for operating the nonvolatile memory device. The method includes generating a first program voltage, applying the generated first program voltage to a first word line to which a first memory cell is connected for performing a first program operation on the first memory cell, determining whether a number of pulses of a pumping clock signal for generating the first program voltage is greater than or equal to a predetermined critical value n (where n is a natural number), and stopping the performing of the first program operation on the first memory cell when the number of pulses of the pumping clock signal is determined to be greater than or equal to the predetermined critical value n.

According to another embodiment, a nonvolatile memory device includes a memory cell array, a voltage generating unit and a determining unit. The memory cell array includes a first word line to which a first memory cell is connected. The voltage generating unit is configured to generate a first program voltage in response to a pumping clock signal, the generated first program voltage being applied to the first word line for performing a most significant bit (MSB) program operation on the first memory cell. The determining unit is configured to output a program stopping signal when a number of pulses of the pumping clock signal is greater than or equal to a predetermined critical value n, where n is a natural number, while applying the generated first program voltage to the first word line.

According to another embodiment, a nonvolatile memory chip includes a memory cell, a clock generator, a charge pumping unit, a regulator, and a determining unit. The memory cell array includes a first word line to which a first memory cell is connected. The clock generator is configured to generate a pumping clock signal from a clock signal, the pumping clock signal comprising clock pulses. The charge pumping unit includes charge pumps and a control circuit, each charge pump being be enabled and disabled by the control circuit to perform a charge pumping operation according to the pumping clock signal to provide a pumping voltage. The regulator is configured to regulate the pumping voltage to generate a first program voltage provided to the first memory cell for performing an MSB program operation on the first memory cell. The determining unit is configured to compare a number of clock pulses of the pumping clock signal with a predetermined critical value during performance of the MSB program operation, and to output a program stopping signal when the number of pulses of the pumping clock signal is greater than the predetermined critical value to stop the performance of the MSB program operation.

BRIEF DESCRIPTION OF THE DRAWINGS

Exemplary embodiments will be more clearly understood from the following detailed description taken in conjunction with the accompanying drawings, in which.

DETAILED DESCRIPTION OF THE EMBODIMENTS

Figure 1:
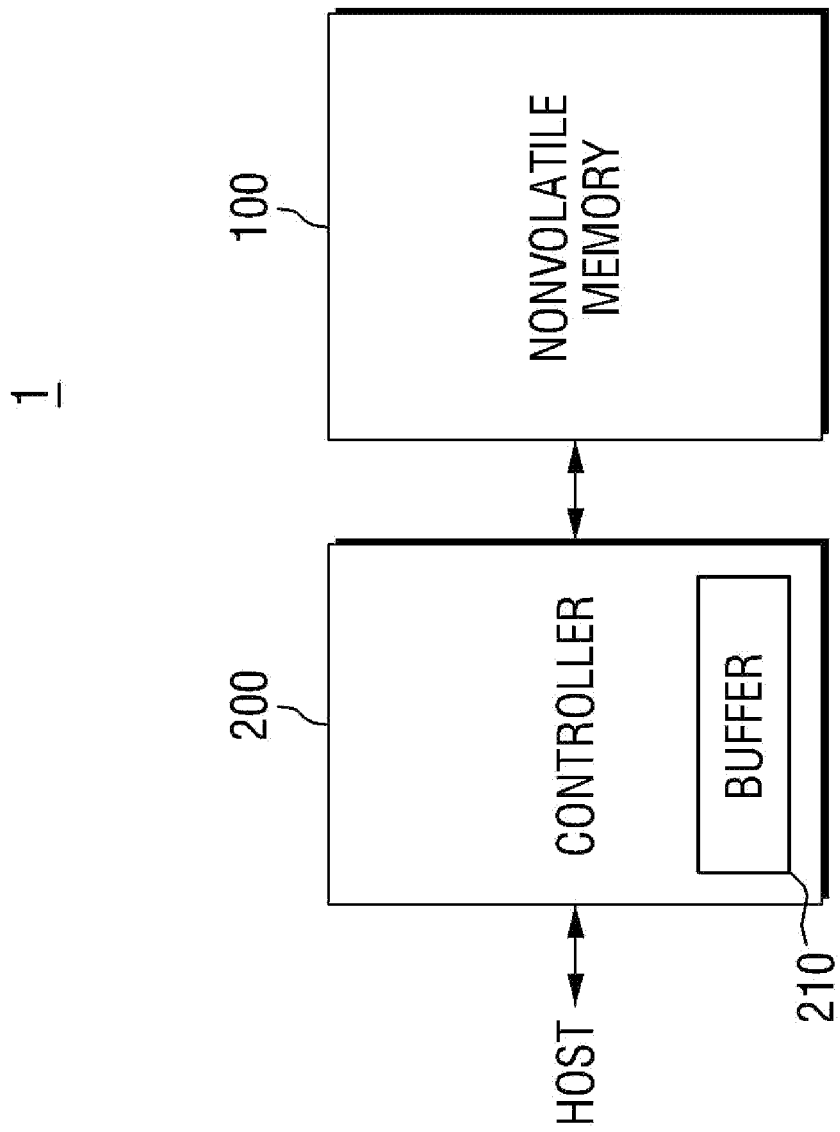
FIG. 1 is a block diagram illustrating a nonvolatile memory device, according to an exemplary embodiment.

Embodiments will be described more fully with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items. The term "exemplary" refers to an illustrative example.

The use of the terms "a" and "an" and "the" and similar referents in the context of the following description and claims are to be construed to cover both the singular and the plural, unless otherwise indicated herein or clearly contradicted by context. The terms "comprising," "having," "including," and "containing" are to be construed as open-ended terms (i.e., meaning "including, but not limited to"), unless otherwise noted.

It will be understood that, although the terms first, second, etc., may be used herein to describe various elements, these elements should not be limited by these terms. These terms are only used to distinguish one element from another element. Thus, for example, a first element, a first component or a first section discussed below could be termed a second element, a second component or a second section without departing from the scope of the present teachings.

The term "unit" or "module", as used herein, means, but is not limited to, a software or hardware component, such as a field programmable gate array (FPGA) or an application specific integrated circuit (ASIC), which performs certain tasks. A unit or module may advantageously be configured to reside in the addressable storage medium and configured to execute on one or more processors. Thus, by way of example, a unit or module may include components, such as software components, object-oriented software components, class components and task components, processes, functions, attributes, procedures, subroutines, segments of program code, drivers, firmware, microcode, circuitry, data, databases, data structures, tables, arrays, and variables. The functionality provided for in the components and units or modules may be combined into fewer components and units or modules or further separated into additional components and units or modules Unless defined otherwise, all technical and scientific terms used herein have the same meaning as commonly understood by one of ordinary skill in the art. It is noted that any and all examples, or exemplary terms provided herein are intended to better illuminate the various embodiments and are not limitations on the scope of the present teachings, unless otherwise specified. Further, unless defined otherwise, all terms defined in generally used dictionaries may not be overly interpreted.

Figure 2:
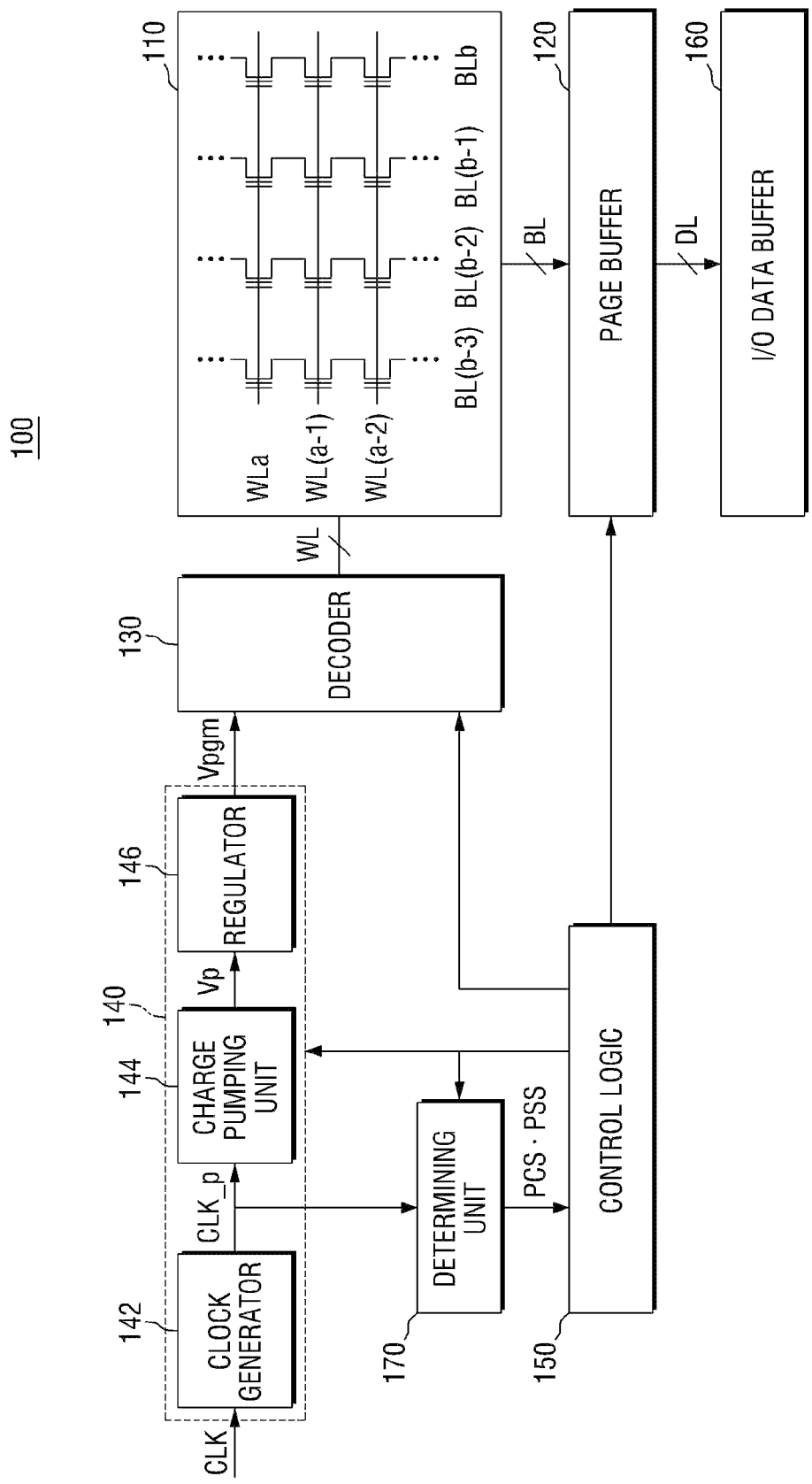
FIG. 2 is a block diagram illustrating a memory chip shown in FIG. 1, according to an exemplary embodiment.
Figure 3:
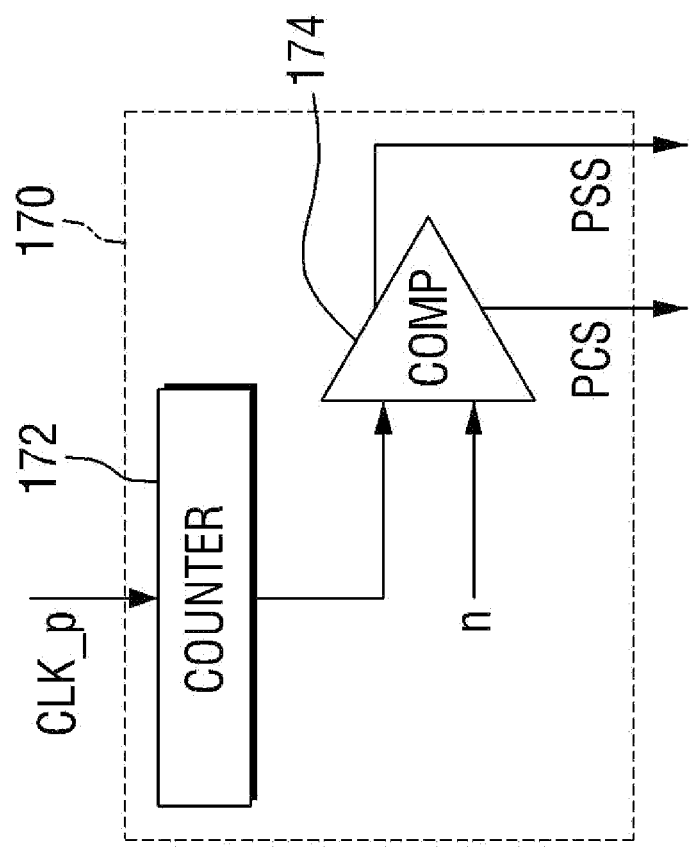
FIG. 3 is a block diagram illustrating a determining unit shown in FIG. 2, according to an exemplary embodiment.

A nonvolatile memory device according to an exemplary embodiment will be described below with reference to FIGS. 1 to 3. FIG. 1 is a block diagram illustrating a nonvolatile memory device, according to an exemplary embodiment. FIG. 2 is a block diagram illustrating a memory chip shown in FIG. 1, and FIG. 3 is a block diagram illustrating a determining unit shown in FIG. 2, according to exemplary embodiments.

Referring to FIG. 1, nonvolatile memory device 1 includes a nonvolatile memory chip 100 and a controller 200. The controller 200 is connected to a host and the nonvolatile memory chip 100. As shown in FIG. 1, the controller 200 may be configured to access the nonvolatile memory chip 100 in response to a request from the host. For example, the controller 200 may be configured to control read, program (write), erase and background operations of the nonvolatile memory chip 100.

The controller 200 may be further configured to interface between the nonvolatile memory chip 100 and the host. In addition, the controller 200 may be configured to drive firmware for controlling the nonvolatile memory chip 100.

As an example, the controller 200 may further include well-known components, such as random access memory (RAM), a processing unit, a host interface, and a memory interface. Here, the RAM may be used as at least one of an operating memory of the processing unit, a cache memory between the nonvolatile memory chip 100 and the host, and a buffer memory between the nonvolatile memory chip 100 and the host. The processing unit may control overall operation of the controller 200.

The host interface may include a protocol to exchange data between the host and the controller 200. For example, the controller 200 may be configured to communicate with an external device (the host) through one of various interface protocols, such as universal serial bus (USB), multimedia card (MMC), peripheral component interconnection (PCI) protocol, PCI-express (PCI-E) protocol, advanced technology electronics (ATA) protocol, serial-ATA protocol, parallel-ATA protocol, small computer small interface (SCSI) protocol, enhanced small disk interface (ESDI) protocol, and integrated drive electronics (IDE) protocol. The memory interface may interface with the nonvolatile memory chip 100. Here, the memory interface may include, for example, a NAND interface or a NOR interface.

According to the depicted embodiment, the controller 200 includes a buffer 210. The buffer 210 may be used for restoring data of the nonvolatile memory chip 100. More specific functions of the buffer 210 are described below.

The nonvolatile memory device 1 may be configured to further include an error correction block (not shown). The error correction block is configured to detect and correct errors in data read from the nonvolatile memory chip 100 using an error correction code (ECC). As an example, the error correction block may be provided as a component of the controller 200, although the various embodiments are not limited thereto. For example, the error correction block may also be provided as a component of the nonvolatile memory chip 100.

The nonvolatile memory chip 100 includes multiple memory cells for storing data. Hereinafter, the configuration of the nonvolatile memory chip 100 according to an exemplary embodiment will be described in more detail with reference to FIG. 2.

Referring to FIG. 2, the nonvolatile memory chip 100 may be a flash memory chip, for example, such as a NAND flash memory chip or a NOR flash memory chip. However, the nonvolatile memory chip 100 may include other types of nonvolatile memory without departing from the scope of the present teachings. In some embodiments, the nonvolatile memory chip 100 may include one of a phase-change random access memory (PRAM), a magneto-resistive random access memory (MRAM), and/or a resistive random access memory (RRAM).

Referring again to FIG. 2, the nonvolatile memory chip 100 includes a memory cell array 110. The memory cell array 110 includes a plurality of word lines WLs (e.g., a word line WLs), a plurality of bit lines BLs (e.g., b bit lines BLs), and a plurality of memory cells MCs defined at intersections of the word line WLs and the bit lines BLs. Each memory cell MC may store r bit data, where r is an integer greater than or equal to 1. For example, in the present embodiment, each memory cell MC may be configured to store 2-bit data consisting of LSB data and MSB data, although the various embodiments are not limited thereto.

The memory cell array 110 may be divided into multiple areas (not shown). In particular, the memory cell array 110 may include a data area for storing general data and a sphere area. Each of the areas of the memory cell array 110 may include a plurality of memory blocks. Specific configurations of the memory cell array 110 are well known to one skilled in the art, and thus detailed descriptions thereof will be omitted.

As shown in FIG. 2, the nonvolatile memory chip 100 further includes a page buffer 120, a decoder 130, a voltage generating unit 140, control logic 150, an input/output (I/O) data buffer 160, and a determining unit 170. The page buffer 120 may be configured to program (or write) data in the memory cell MC included in the memory cell array 110 and to read data from the memory cell MC under the control of the control logic 150. The decoder 130 is controlled by the control logic 150, and is configured to select a memory block of the memory cell array 110 and to select a word line WL of the selected memory block. The word line WL selected by the decoder 130 may be driven by a word line voltage generated from the voltage generating unit 140. The voltage generating unit 140 is controlled by the control logic 150, and is configured to generate a word line voltage, e.g., a read voltage, a program voltage (or a write voltage), a pass voltage, a local voltage or a verify voltage, to be supplied to the memory cell array 110. The I/O data buffer 160 receives read results from the page buffer 120 and transmits the same to the outside, and transfers external data from the outside to the page buffer 120. The control logic 150 is configured to control the overall operation of the nonvolatile memory chip 100.

In the depicted embodiment, the voltage generating unit 140 includes a clock generator 142, a charge pumping unit 144, and a regulator 146. The clock generator 142 generates a pumping clock signal CLK_p from an externally supplied clock signal CLK. The pumping clock signal CLK_p may include multiple clock pulses. Each of the clock pulses may have a longer period than the externally supplied clock signal CLK, and may be output with a delay of a predetermined time, for example. The charge pumping unit 144 may include multiple charge pumps and a control circuit. Each of the multiple charge pumps may be enabled or disabled by the control circuit and may perform a charge pumping operation according to the pumping clock signal CLK_p generated from the clock generator 142. The regulator 146 regulates the pumping voltage Vp output from the charge pumping unit 144 to generate a word line voltage, such as program voltage Vpgm, for example. The generated program voltage Vpgm is provided to the memory cell MC through the decoder 130 in a program operation.

The determining unit 170 is configured to determine whether to continue performing a program operation on the memory cell MC. In particular, while the generated program voltage Vpgm is being applied to word lines WLa to WL(a-2), for example, the determining unit 170 determines if the number of pulses of the pumping clock signal CLK_p is greater than or equal to a predetermined critical value n (where n is a natural number). When the number of pulses of the pumping clock signal CLK_p is less than the predetermined critical value n, the determining unit 170 outputs a program continuation signal (PCS) to the control logic 150 to continue performance of the program operation on the memory cell MC. When the number of pulses of the pumping clock signal CLK_p is equal to or greater than the predetermined critical value n, the determining unit 170 outputs a program stopping signal PSS to the control logic 150 to stop performance of the program operation on the memory cell MC.

Therefore, by the operation of the determining unit 170, the nonvolatile memory device 1 is able to reduce unnecessary power consumption while performing a program operation on the memory cell MC, and reduce program time. In addition, the nonvolatile memory device 1 according to the various embodiments is able to detect a progressive word line bridge defect, as described below in more detail.

FIG. 3 is a block diagram showing an example of the determining unit 170, according to an embodiment. Referring to FIG. 3, the determining unit 170 includes a counter 172 and a comparator 174. The counter 172 receives the pumping clock signal CLK_p from the clock generator 142 (shown in FIG. 2), and counts the number of pulses of the pumping clock signal CLK_p. The counter 172 outputs the counting result to the comparator 174.

The comparator 174 receives the output of the counter 172 as a first input and the predetermined critical value n as a second input, and compares the first and second inputs. When the output of the counter 172 is less than the predetermined critical value n, the comparator 174 outputs the program continuation signal PCS, and when the output of the counter 172 is greater than or equal to the predetermined critical value n, the comparator 174 outputs the program stopping signal PSS.

While FIG. 3 illustrates the determining unit 170 as including only the counter 172 and the comparator 174, the determining unit 170 is not limited to this configuration. For example, in alternative embodiments, the determining unit 170 may have various alternative configurations, without departing from the scope of the present teachings.

Figure 4:
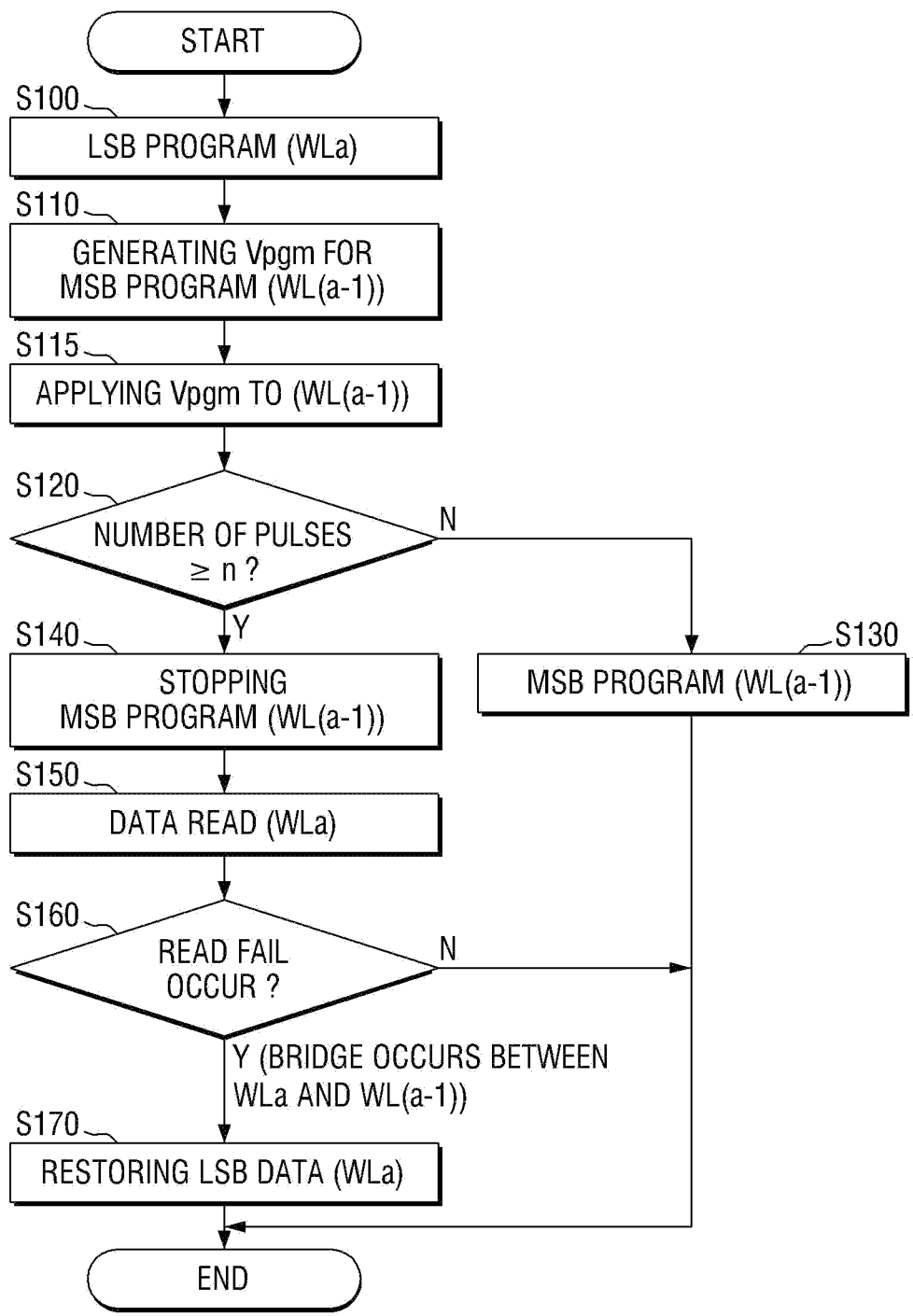
FIG. 4 is a flow chart illustrating operation of a nonvolatile memory device, according to an exemplary embodiment.

Operation of a nonvolatile memory device according to an exemplary embodiment will be described with reference to FIGS. 4 to 6. FIG. 4 is a flow chart illustrating operation of a nonvolatile memory device according to an illustrative embodiment, and FIGS. 5 and 6 are diagrams illustrating the operation of a nonvolatile memory device according to the illustrative embodiment.

Referring to FIG. 4, an LSB program operation is performed on a memory cell connected to a second word line WLa in step S100, for example. In particular, referring to FIG. 5, a nonvolatile memory device (e.g., nonvolatile memory device 1 of FIG. 1) according to an embodiment may alternately perform an LSB program operation and an MSB program operation on the memory cell MC connected to each word line WL. For example, the nonvolatile memory device 1 may alternately perform the LSB and MSB program operations in the order shown in FIG. 5.

That is, the nonvolatile memory device 1 may perform an LSB program operation (1) on the memory cell MC connected to a third word line WL(a-2) and then perform an LSB program operation (2) on the memory cell MC connected to a first word line WL(a-1). Subsequently, the nonvolatile memory device 1 may perform an MSB program operation (3) on the memory cell MC connected to the third word line WL(a-2) and then perform an LSB program operation (4) on the memory cell MC connected to a second word line WLa. Thereafter, the nonvolatile memory device 1 may perform an MSB program operation (5) on the memory cell MC connected to the first word line WL(a-1). For convenience of explanation, step S100 of FIG. 4 corresponds to programming step (4) of FIG. 5, that is, performing the LSB program operation on the memory cell MC connected to the second word line WLa, which will be described further, below.

Figure 5:
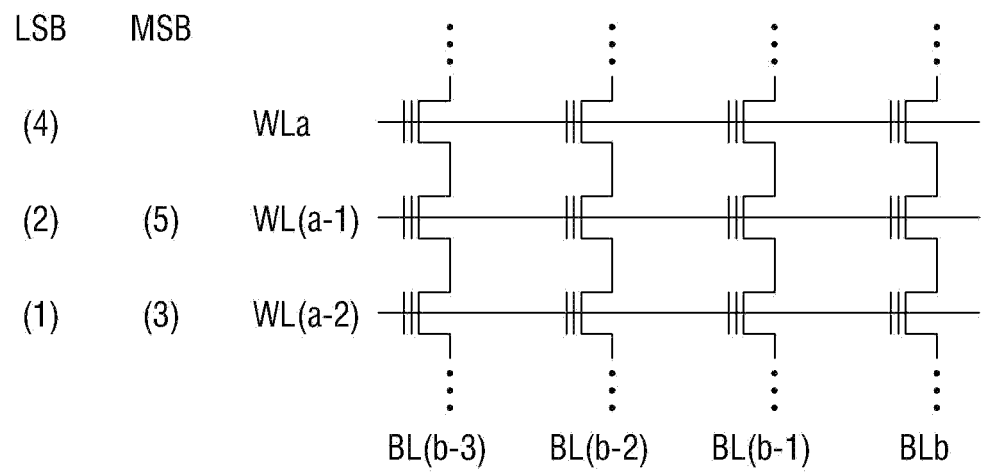
FIGS. 5 and 6 are diagrams illustrating the operation of the nonvolatile memory device in FIG. 4, according to an exemplary embodiment.
Figure 6:
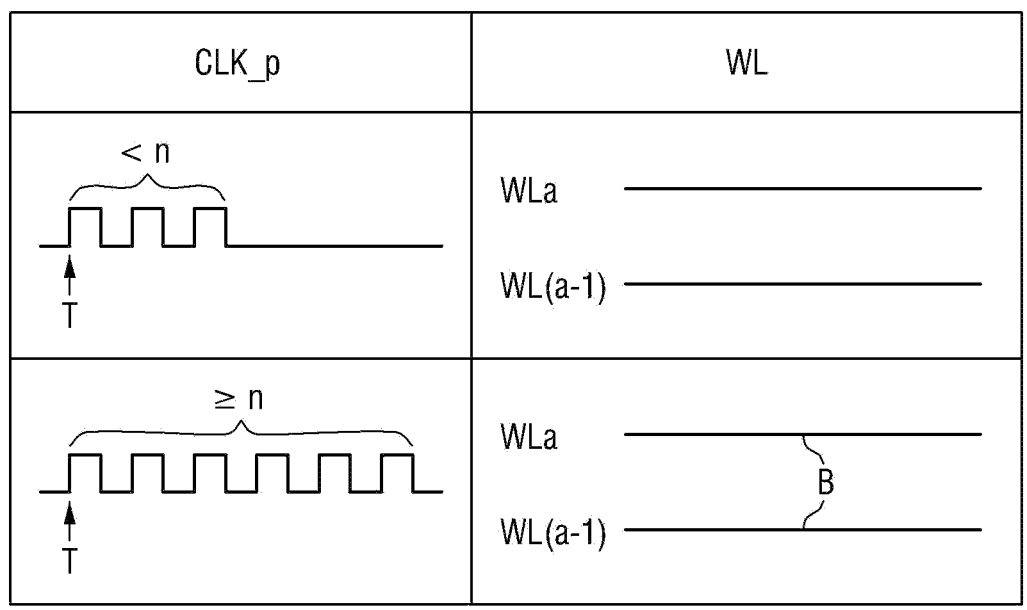

Referring again to FIG. 4, in order to perform an MSB program operation on the memory cell connected to the first word line WL(a-1) (programming step (5) in FIG. 5), a program voltage Vpgm is generated in step S110. Referring to FIG. 2, the voltage generating unit 140 generates the program voltage Vpgm to perform the MSB program operation on the memory cell connected to the first word line WL(a-1). The generated program voltage Vpgm is applied to the first word line WL(a-1) in step S115.

Then, it is determined in block S120 whether the number of pulses of the pumping clock signal CLK_p is greater than or equal to a predetermined critical value n, where n is a natural number. When it is determined in step S120 that the number of pulses of the pumping clock signal CLK_p is less than the predetermined critical value n, the MSB program operation is performed (or continues to be performed) on the memory cell connected to the first word line WL(a-1) in block S130. Conversely, when it is determined in step S120 that the number of pulses of the pumping clock signal CLK_p is greater than or equal to the predetermined critical value n, performing the MSB program operation on the memory cell connected to the first word line WL(a-1) is stopped in block S140.

More particularly, referring to FIGS. 2 and 6, when a progressive word line bridge defect (B) occurs between the first word line WL(a-1) and the second word line WLa (indicated in the bottom right side of the Table shown in FIG. 6), the first word line WL(a-1) and the second word line WLa are connected to the regulator 140 through the decoder 130. Thus, even when the charge pumping unit 144 generates a sufficiently high pumping voltage Vp to be applied to the first word line WL(a-1), the output of the regulator 140 may not be maintained at a desired level of the program voltage Vpgm due to leakage, for example. In this case, in order to maintain a desired program voltage Vpgm, the pumping clock signal CLK_p is continuously applied to the charge pumping unit 144 (indicated in the bottom left side of the Table shown in FIG. 6). Under these circumstances, if the program operation is continuously performed on the memory cell MC, an unnecessarily large amount of power is consumed and the program time is unnecessarily extended.

Therefore, in the depicted embodiment, starting from time T in FIG. 6, at which the program voltage Vpgm is generated and begins to be applied to the first word line WL(a-1), the determining unit 170 compares the number of pulses of the pumping clock signal CLK_p with the predetermined critical value n. Based on the comparison, the determining unit 170 determines when the number of pulses of the pumping clock signal CLK_p becomes greater than or equal to the predetermined critical value n, and then outputs the program stopping signal PSS to the control logic 150 to stop performance of the program operation (e.g., the MSB program operation on the memory cell MC connected to the first word line WL(a-1) started in step S110). As such, the MSB program operation on the memory cell MC connected to the first word line WL(a-1) is stopped, thereby reducing unnecessary power consumption during the program operation and eliminating (or reducing) unnecessary program time.

Conversely, when a progressive word line bridge defect (B) does not occur between the first word line WL(a-1) and the second word line WLa (indicated in the upper right side of Table shown in FIG. 6), leakage may not occur between the first word line WL(a-1) and the second word line WLa. Therefore, when the pumping clock signal CLK_p is applied to the charge pumping unit 144 for a predetermined time, the output of the regulator 140 becomes the desired program voltage Vpgm while the first word line WL(a-1) is programmed (indicated in the upper left side of Table shown in FIG. 6). The number of pulses of the pumping clock signal CLK_p occurring during the predetermined time is less than the predetermined critical value n.

Therefore, in this embodiment, starting from the time T in FIG. 6, at which the program voltage Vpgm is generated and begins to be applied to the first word line WL(a-1), the determining unit 170 compares the number of pulses of the pumping clock signal CLK_p with the predetermined critical value n. Based on the comparison, the determining unit 170 determines when the number of pulses of the pumping clock signal CLK_p is less than the predetermined critical value n, and outputs a program continuation signal PCS to the control logic 150 to continue performance of the program operation.

Here, the critical value n may be determined in advance as an appropriate value according to the operating conditions of the nonvolatile memory device 1. In various embodiments, the predetermined critical value n may be adaptively changed according to the operating conditions of the nonvolatile memory device 1.

Referring again to FIG. 4, after stopping the performance of the MSB program operation on the memory cell connected to the first word line WL(a-1) in step S140, the LSB data for the memory cell connected to the second word line WLa is read in step S150, e.g., under control of the control logic 150. As a result, when a read fail occurs, as determined in step S160, the LSB data for the memory cell connected to the second word line WLa is restored in step S170. The read fail may occur when a progressive word line bridge defect (B) occurs between the first word line WL(a-1) and second word line WLa, as discussed above. The process ends after the LSB data is restored in block S170, when a read fail does not occur as determined in step S160, or after the MSB program operation is performed on the memory cell connected to the first word line WL(a-1) in block S130.

As shown in FIG. 6, when a progressive word line bridge defect (B) occurs between the first word line WL(a-1) and the second word line WLa, the reliability of the LSB program operation performed in step S100 of FIG. 4 cannot be ensured due to leakage, for example. Therefore, when the program stopping signal PSS is output by the determining unit 170, the controller 200 reads the LSB data stored in the memory cell MC connected to the second word line WLa to detect whether or not a read fail occurs. If a read fail occurs, the controller 200 determines that a progressive word line bridge defect (B) occurs between the first word line WL(a-1) and the second word line WLa, and an operation for restoring the data is performed.

The buffer 210 included in the controller 200 may be used in the restoring operation. In particular, the buffer 210 included in the controller 200 may temporarily store LSB data associated when the LSB program operation performed on the memory cell MC connected to the second word line WLa in step S100 of FIG. 4. Thereafter, when it is determined in step S160 that a read fail occurs, and thus there is a progressive word line bridge defect (B) between the first word line WL(a-1) and the second word line WLa, the controller 200 restores the LSB data of the memory cell MC connected to the second word line WLa using the data temporarily stored in the buffer 210.

In summary, the nonvolatile memory device 1 according to an embodiment generates the program voltage Vpgm (e.g., a program voltage for programming MSB data), applies the generated program voltage Vpgm to the first word line WL(a-1) for performing a program operation of the MSB data, and stops performing the program operation when the number of pulses of the pumping clock signal CLK_p is determined to be greater than or equal to the predetermined critical value n, where n is a natural number, thereby reducing unnecessary power consumption and shortening the overall program time. Next, the second word line WLa adjacent to the first word line WL(a-1) is read with the program operation is stopped. When a read fail occurs, it is determined that a progressive word line bridge defect (B) occurs between the first word line WL(a-1) and the second word line WLa, and the data (e.g., LSB data) for the memory cell MC connected to the second word line WLa is restored using the buffer 210 included in the controller 200.

While an illustrative operation of the nonvolatile memory device has been described in the present embodiment, it is understood that the nonvolatile memory device may operate in various manners. Thus, there may be many variations in the operation of the nonvolatile memory device according to various embodiments according to the necessity.

Operations of nonvolatile memory devices according to alternative embodiments will be described with reference to FIGS. 7 to 9.

Figure 7:
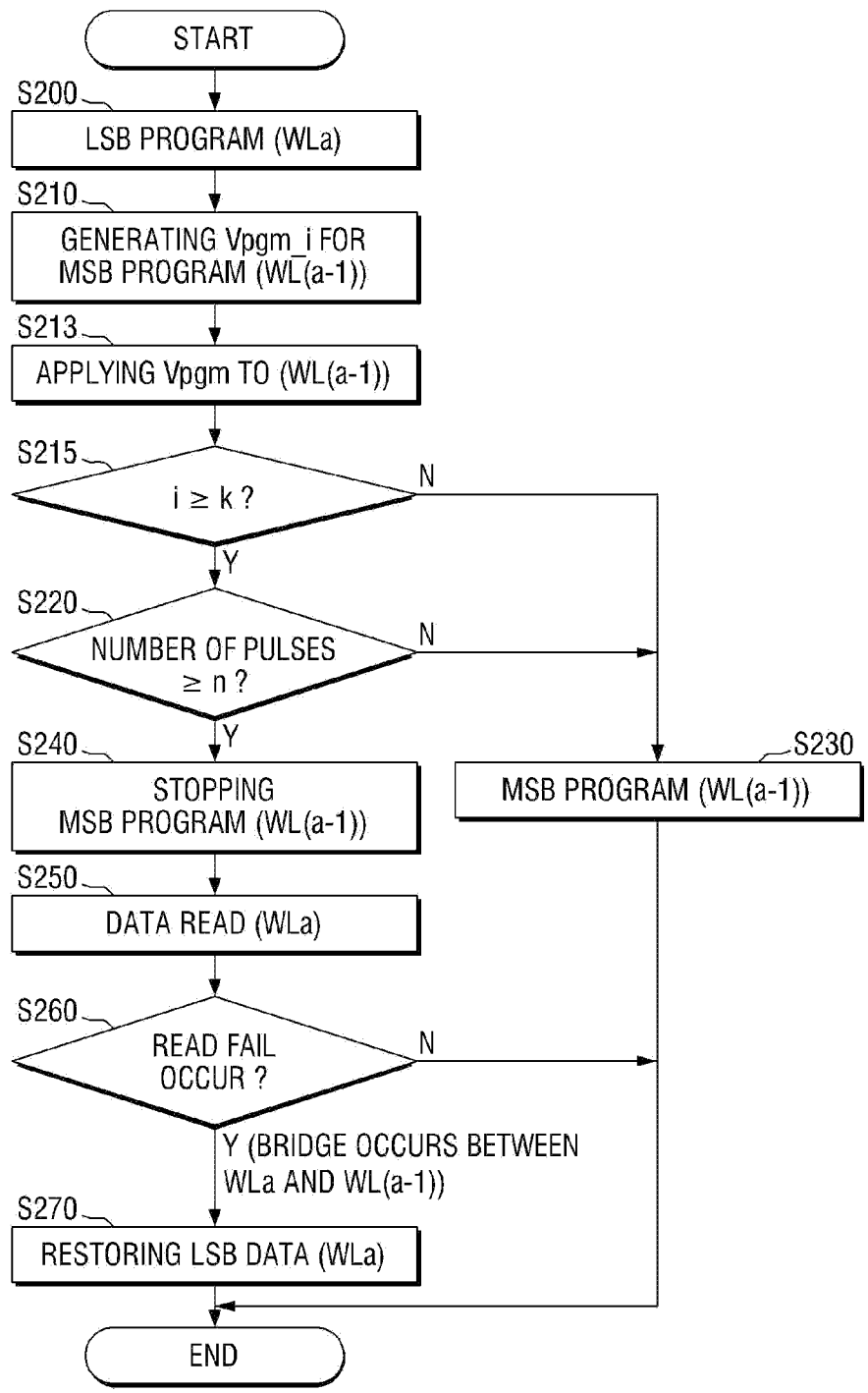
FIG. 7 is a flow chart illustrating operation of a nonvolatile memory device, according to another exemplary embodiment.
Figure 8:
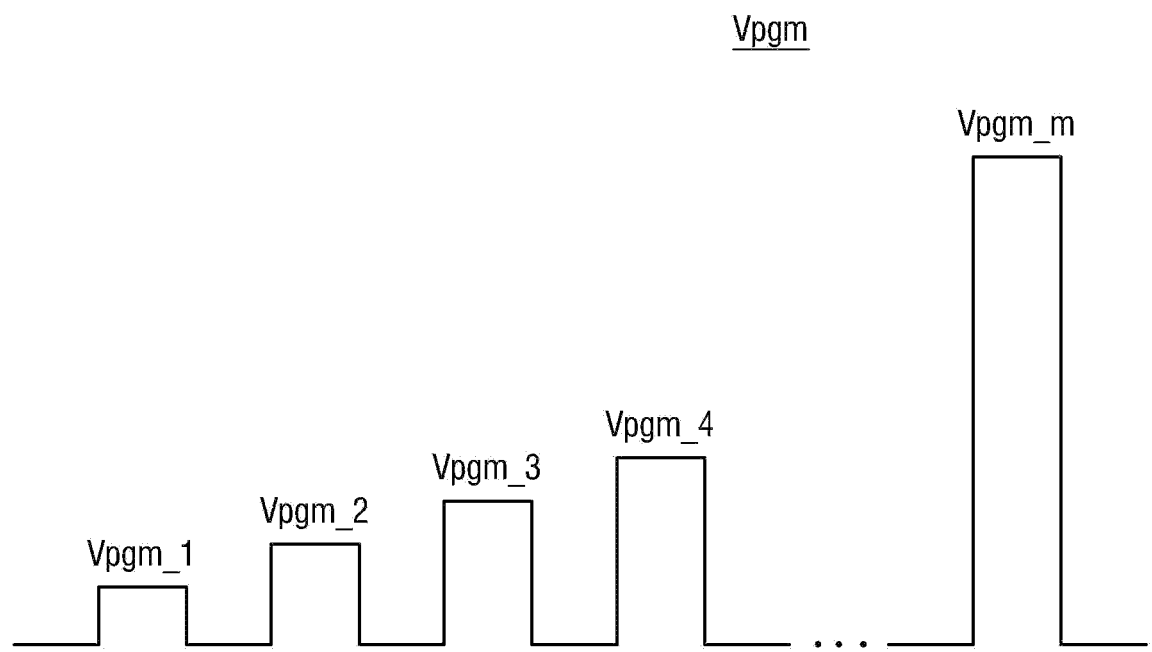
FIG. 8 is a chart illustrating incremental step pulses of a program voltage, according to another exemplary embodiment.

FIG. 7 is a flow chart illustrating operation of a nonvolatile memory device and FIG. 8 is a chart illustrating incremental step pulses of a program voltage, according to another exemplary embodiment.

Referring to FIG. 7, an LSB program operation is performed on a memory cell connected to a second word line WLa in step S200, which is the substantially the same as discussed above with reference to step S100. Therefore, the description thereof will not be repeated.

Next, in order to perform an MSB program operation on a memory cell connected to the first word line WL(a-1), a program voltage Vpgm_i is generated in step S210. In particular, referring to FIG. 8, in the present embodiment, the program voltage Vpgm_i for performing the MSB program operation on the memory cell connected to the first word line WL(a-1) may include $1^{st}$ to $m^{th}$ sub-program voltages Vpgm_1~Vpgm_m (where m is a natural number), which sequentially increase in magnitude. In other words, in the present embodiment, an incremental step pulse program (ISPP), for example, may be used in programming the memory cell MC connected to the first word line WL(a-1).

Referring again to FIG. 7, the generated program voltage Vpgm_i is applied to the first word line WL(a-1) in step S213. Then, it is determined in step S215, e.g., by the determining unit 170, control logic 150 and/or the controller 200, whether the generated program voltage Vpgm_i is greater than or equal to the kth sub-program voltage Vpgm_k, where k is a natural number not greater than m ($1 < k \leq m$). When the program voltage Vpgm_i is less than the kth sub-program voltage Vpgm_k, the MSB program operation is performed on the first word line WL(a-1) and the process ends. When the program voltage Vpgm_i is greater than or equal to the kth sub-program voltage Vpgm_k, a comparison of the number of pulses of the pumping clock signal CLK_p to the predetermined critical value n is performed in step S220.

The reason for this is that, when the program voltage Vpgm_i includes the $1^{St}$ to $m^{th}$ sub-program voltages (Vpgm_1~Vpgm_m) sequentially increasing in magnitude as shown in FIG. 8, the (i-1)th sub-program voltage Vpgm_(i-1) is smaller than the ith sub-program voltage Vpgm_i, and therefore is less affected by a progressive word line bridge defect (B) occurring between the first word line WL(a-1) and the second word line WLa. That is, even when leakage occurs between the first word line WL(a-1) and the second word line WLa, the output of the regulator 140 can easily reach a desired program voltage level. The kth sub-program voltage Vpgm_k is previously determined to be the sub-program voltage at which a progressive word line bridge defect (B) occurring between the first word line WL(a-1) and the second word line WLa may begin having a meaningful effect.

Therefore, in this embodiment, the determining unit 170 compares the number of pulses of the pumping clock signal CLK_p with the predetermined critical value n (e.g., where n is a natural number) only for the program voltage Vpgm_i greater than or equal to the kth sub-program voltage Vpgm_k ($k \leq i \leq m$), where each sub-program voltage Vpgm_i greater than or equal to the sub-program voltage Vpgm_k may be more affected by a progressive word line bridge defect (B) occurring between the first word line WL(a-1) and the second word line WLa. Therefore, in step S220, the determining unit 170 compares the number of pulses of the pumping clock signal CLK_p with the predetermined critical value n to determine whether the number of pulses of the pumping clock signal CLK_p is greater than or equal to the predetermined critical value n for each Vpgm_i greater than or equal to the kth sub-program voltage Vpgm_k. The subsequent operations depicted by steps S230 to S270 are substantially the same as the operations depicted by steps S130 to S170 in FIG. 4, described above.

Figure 9:
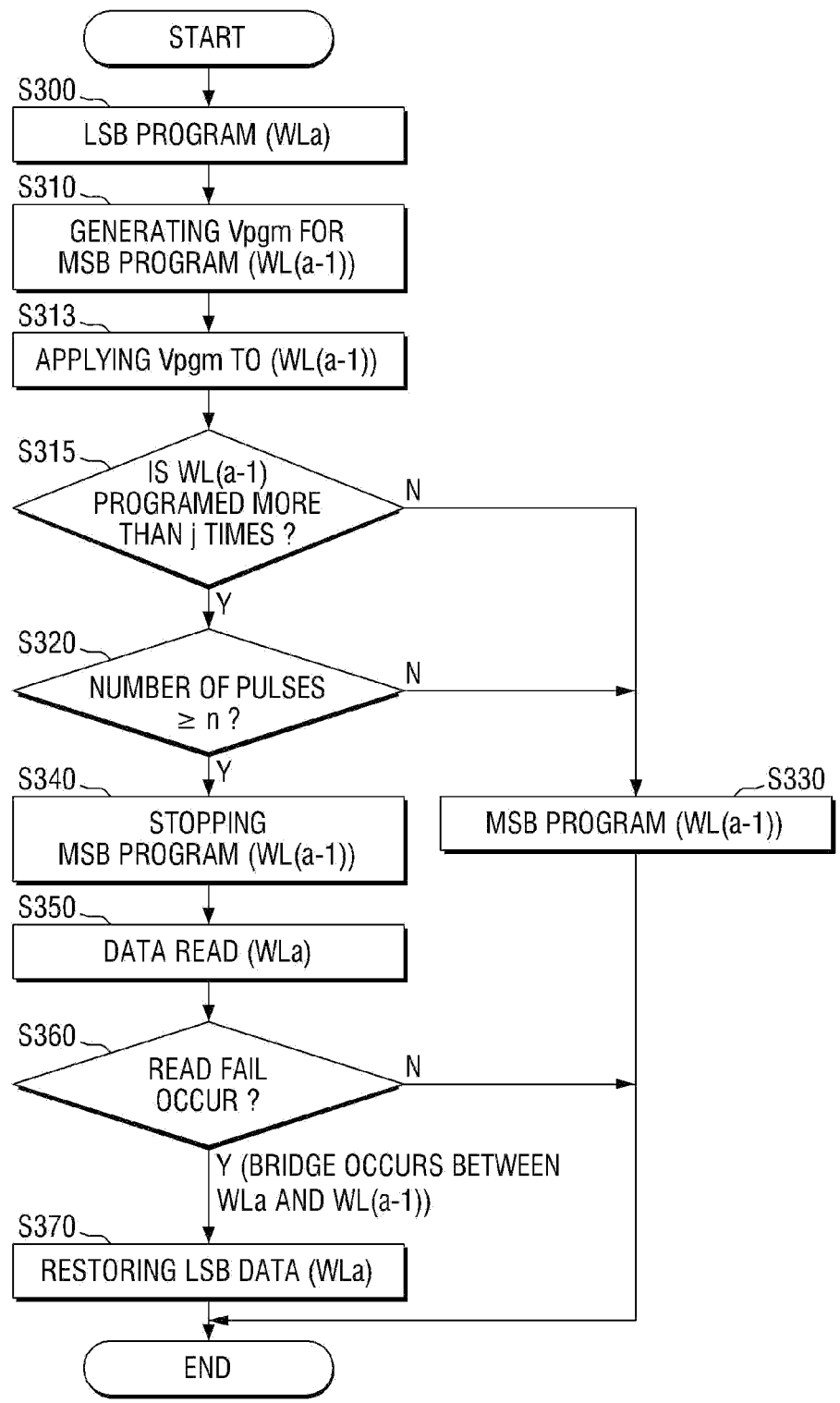
FIG. 9 is a flow chart illustrating operation of a nonvolatile memory device, according to still another exemplary embodiment.

FIG. 9 is a flow chart illustrating an operation of a nonvolatile memory device, according to still another exemplary embodiment.

Referring to FIG. 9, an LSB program operation is performed on a memory cell connected to the second word line WLa in step S300, and in order to perform an MSB program operation on a memory cell connected to the first word line WL(a-1), a program voltage Vpgm is generated in step S310. Steps S300 and S310 are substantially the same as described above with respect to steps S100 and S110 in FIG. 4, and thus the description thereof will not be repeated.

The generated program voltage Vpgm is applied to the first word line WL(a-1) in step S313. Then, in order to perform an MSB program operation on the memory cell MC connected to the first word line WL(a-1), it is determined, e.g., by the determining unit 170, the control logic 150 and/or the controller 200, whether the program voltage Vpgm is applied j times in step S315, where j is a natural number. When the first word line WL(a-1) is programmed less than the j times, the MSB program operation is performed on the first word line WL(a-1) and the process ends. When the first word line WL(a-1) is programmed greater than or equal to j times, a comparison of the number of pulses of the pumping clock signal CLK_p to the predetermined critical value n is performed in step S320.

The reason for this is that the probability of a progressive word line bridge defect (B), shown in FIG. 6, occurring between word lines WL generally increases as the number of times the program voltage Vpgm is applied to the word line WL increases. Therefore, to promote device efficiency, it is not desirable to perform the determining operation of step S320 during the program operation of a word line WL to which the program voltage Vpgm has been applied a relatively small number of times. Therefore, in the present embodiment, the determining step and subsequent operations, steps S320 to S370, are performed only on word lines WL to which the program voltage Vpgm is applied j times or more, as determined in step S315, thereby improving the operating efficiency of the nonvolatile memory device.

Although not shown, in some embodiments, the operations of the nonvolatile memory device according to FIGS. 7 and 9 may combined. The operations of the nonvolatile memory devices according to the various additional embodiments are not limited to those of the previous described embodiments.

Figure 10:
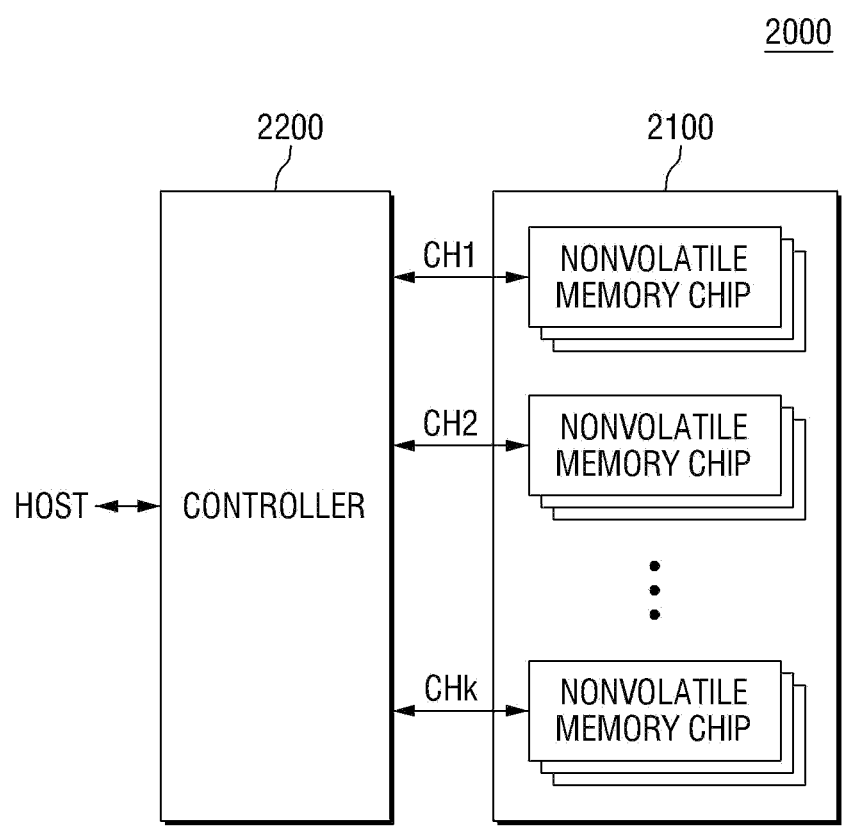
FIG. 10 is a block diagram showing an illustrative application of a nonvolatile memory device, according to exemplary embodiments.

FIG. 10 is a block diagram showing an illustrative application of a nonvolatile memory device, according to exemplary embodiments.

Referring to FIG. 10, the nonvolatile memory device according to the various embodiments can be applied to a memory system 2000. The memory system 2000 includes multiple memory chips 2100 and a controller 2200. Here, the multiple memory chips 2100 may be divided into multiple groups, as shown in FIG. 10. The respective groups of the memory chips 2100 may be configured to communicate with the controller 2200 through a common channel. For example, as shown in FIG. 10, the memory chips 2100 may communicate with the controller 2200 through first to kth channels CH1 to CHk.

The controller 2200 and the memory chips 2100 may be integrated into one semiconductor device. The controller 2200 and the memory chips 2100 may be integrated to form a memory card. For example, the controller 2200 and the memory chips 2100 may be integrated into one semiconductor device to form a PC card (originally PCMCIA or PCM-CIA card), a Compact Flash (CF) card, a Smart Media (SM) Card, a memory stick, a Multi Media Card (MMC, RS-MMC, MMCmicro), a Secure Digital card (SD, miniSD, microSD), a Universal Flash storage (UFS), and the like, although they are not limited thereto.

The controller 2200 and the memory chips 2100 may be integrated into one semiconductor device to form a Solid State Disk/Drive (SSD). The SSD include a storage device configured to store data in a semiconductor memory. In the case where the memory system 2000 is used as an SSD, an operating speed of a host connected with the memory system 2000 is higher.

In addition, the controller 2200 and the memory chips 2100 may be packaged in a variety of ways, according to design choice. For example, the controller 2200 and the memory chips 2100 may be mounted in a package on package (PoP), a ball grid array (BGA) package, a chip scale package (CSP), a plastic leaded chip carrier (PLCC), a plastic dual in-line package (PDIP), a die in waffle pack, a die in wafer form, a chip-on-board (COB), a ceramic dual in-line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multi-chip package (MCP), a wafer-level fabricated package (WFP) or a wafer-level processed stack package (WSP).

Figure 11:
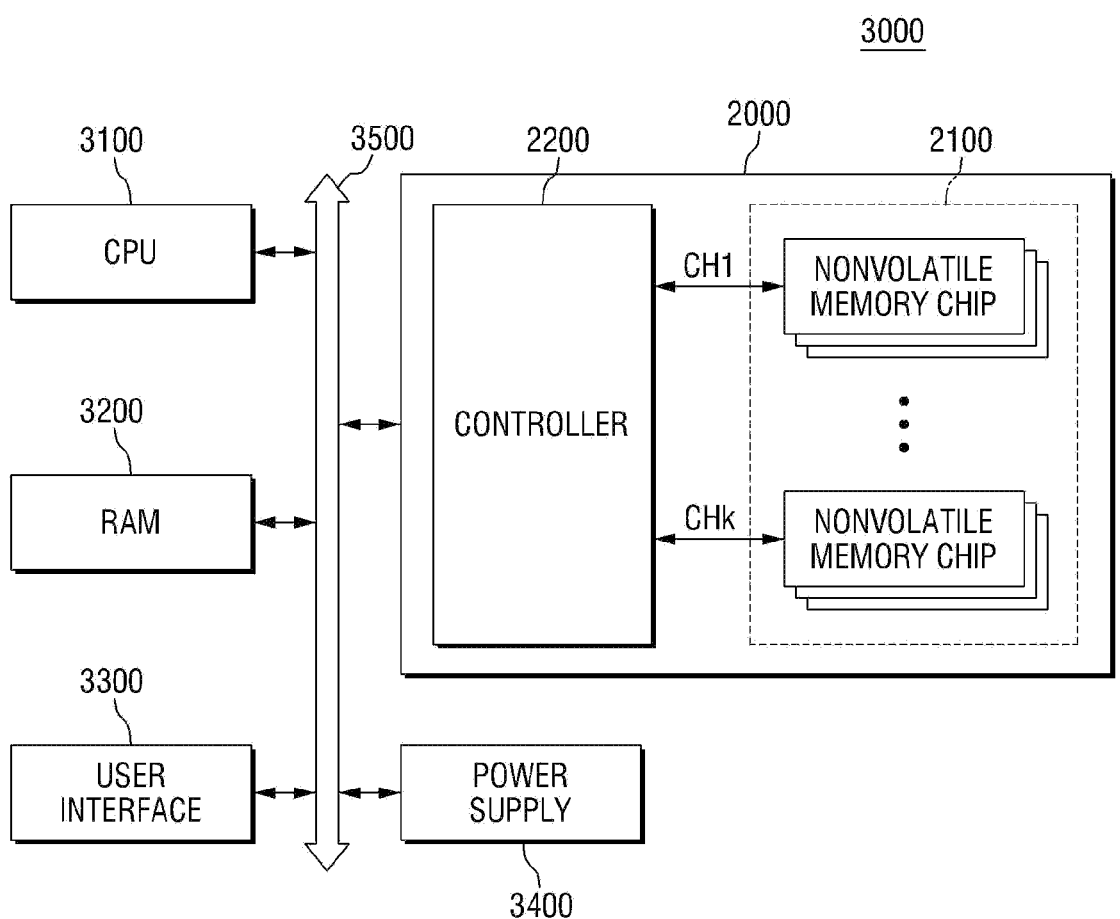
FIG. 11 is a block diagram of a computing system including the nonvolatile memory device, according to exemplary embodiments.

FIG. 11 is a block diagram of a computing system including the nonvolatile memory device, according to exemplary embodiments.

Referring to FIG. 11, computing system 3000 includes a central processing unit (CPU) 3100, a random access memory (RAM) 3200, a user interface 3300, a power supply 3400, and a memory system 2000. The memory system 2000 is electrically connected to the CPU 3100, the RAM 3200, the user interface 3300 and the power supply 3400 through the system bus 3500. The data supplied through the user interface 3300 or processed by the CPU 3100 may be stored in the memory system 2000.

In FIG. 11, the memory chips 2100 are connected to the system bus 3500 through the controller 2200. However, the memory chips 2100 alternatively may be configured to connect directly to the system bus 3500.

As another example, the computing system 3000 may comprise or be incorporated in a computer, a portable computer, an ultra mobile personal computer (UMPC), a work station, a net-book, a personal digital assistant (PDA), a web tablet, a wireless phone, a mobile phone, a smart phone, an e-book, a portable game console, a navigation device, a black box, a digital camera, a 3-dimensional television, a digital audio recorder, a digital audio player, a digital picture recorder, a digital picture player, digital video recorder, a digital video player, a device capable of transmitting/receiving information in wireless environments, one of various electronic devices constituting a home network, one of various electronic devices constituting a computer network, one of various electronic devices constituting a telematics network, RFID devices, or embedded systems, although they are not limited thereto.

While the inventive concept has been described with reference to exemplary embodiments, it will be apparent to those skilled in the art that various changes and modifications may be made without departing from the spirit and scope of the present inventive concept. Therefore, it should be understood that the above embodiments are not limiting, but illustrative.

What is claimed is:

1. A method of operating a nonvolatile memory device, the method comprising:
    applying a pumping clock signal to a charge pumping unit to generate a first program voltage;
    applying the generated first program voltage to a first word line to which a first memory cell is connected for performing a first program operation on the first memory cell;
    determining whether a number of pulses of the pumping clock signal applied to the charge pumping unit to generate the first program voltage is greater than or equal to a predetermined critical value n, where n is a natural number; and
    stopping the performing of the first program operation on the first memory cell when the number of pulses of the pumping clock signal is determined to be greater than or equal to the predetermined critical value n.

2. The method of claim 1, further comprising:
    before applying the generated first program voltage to the first word line, applying a second program voltage to a second word line to which a second memory cell is connected for performing a second program operation on the second memory cell; and
    after stopping the performing of the first program operation on the first memory cell, reading data stored in the second memory cell, and when a read fail occurs, determining that a progressive word line bridge occurs between the first word line and the second word line.

3. The method of claim 2, wherein the first word line is adjacent to the second word line.

4. The method of claim 2, wherein the first program operation performed on the first memory cell comprises a most significant bit (MSB) program operation.

5. The method of claim 4, wherein the second program operation performed on the second memory cell comprises a least significant bit (LSB) program operation.

6. The method of claim 5, further comprising:
    restoring LSB data stored in the second memory cell when it is determined that the progressive word line bridge occurs between the first word line and the second word line.

7. The method of claim 1, wherein the first program voltage includes $1^{st}$ to mth sub-program voltages sequentially increasing in magnitude, where m is a natural number, the method further comprising:
    determining whether the generated first program voltage is greater than or equal to a kth sub-program voltage $Vpgm\_k$, where k is a natural number not greater than m ($1 < k \leq m$), and wherein whether the number of pulses of the pumping clock signal is greater than or equal to the predetermined critical value n is determined only when the generated first program voltage is determined to be greater than or equal to the kth sub-program voltage Vpgm_k.

8. The method of claim 1, further comprising:
determining whether the generated first program voltage has been applied greater than j times to the first word line, where j is a natural number,
wherein whether the number of pulses of the pumping clock signal is greater than or equal to the predetermined critical value n is determined only when the generated first program voltage is determined to have been applied to the first word line greater than j times.

9. The method of claim 1, wherein determining whether the number of pulses of the pumping clock signal for generating the first program voltage is greater than or equal to the predetermined critical value n comprises comparing the number of pulses of the pumping clock signal to the predetermined critical value n while applying the generated first program voltage to the first word line.

10. A nonvolatile memory device comprising:
a memory cell array including a first word line to which a first memory cell is connected;
a voltage generating unit configured to generate a first program voltage in response to a pumping clock signal, the generated first program voltage being applied to the first word line for performing a most significant bit (MSB) program operation on the first memory cell; and
a determining unit configured to output a program stopping signal when a number of pulses of the pumping clock signal is greater than or equal to a predetermined critical value n, where n is a natural number, while applying the generated first program voltage to the first word line.

11. The nonvolatile memory device of claim 10, wherein the memory cell array further includes a second word line to which a second memory cell is connected, the second word line being adjacent to the first word line, and
wherein the voltage generating unit is further configured to generate a second program voltage to apply to the second word line for performing a least significant bit (LSB) program operation on the second memory cell, before generating the first program voltage.

12. The nonvolatile memory device of claim 11, further comprising:
a controller configured to read LSB data from the second memory cell connected to the second word line in response to the program stopping signal, and when a read fail occurs, to determine that a progressive word line bridge occurs between the first word line and the second word line.

13. The nonvolatile memory device of claim 12, wherein the controller comprises a buffer configured to store the LSB data during the LSB program operation performed on the second memory cell, the controller being further configured to restore the LSB data for the second memory cell using the LSB data stored in the buffer when it is determined that the progressive word line bridge occurs between the first word line and the second word line.

14. The nonvolatile memory device of claim 10, wherein the first program voltage includes $1^{st}$ to mth sub-program voltages sequentially increasing in magnitude, where m is a natural number, and
wherein the determining unit is further configured to compare the number of pulses of the pumping clock signal to the predetermined critical value n only when the generated first program voltage is determined to be greater than or equal to a kth sub-program voltage Vpgm_k, where k is a natural number not greater than m ($1 < k \leq m$).

15. The nonvolatile memory device of claim 10, wherein the determining unit is further configured to compare the number of pulses of the pumping clock signal to the predetermined critical value n only when the generated first program voltage has been applied greater than j times to the first word line, where j is a natural number.

16. The nonvolatile memory device of claim 10, wherein the determining unit comprises:
a counter configured to count the number of pulses of the pumping clock signal; and
a comparator configured to compare the number of pulses output by the counter with the predetermined critical value n.

17. The nonvolatile memory device of claim 10, wherein the nonvolatile memory device includes a NAND flash memory device.

18. A nonvolatile memory chip comprising:
a memory cell array including a first word line to which a first memory cell is connected;
a clock generator configured to generate a pumping clock signal from a clock signal, the pumping clock signal comprising clock pulses;
a charge pumping unit comprising a plurality of charge pumps and a control circuit, each charge pump being be enabled and disabled by the control circuit to perform a charge pumping operation according to the pumping clock signal to provide a pumping voltage;
a regulator configured to regulate the pumping voltage to generate a first program voltage provided to the first memory cell for performing a most significant bit (MSB) program operation on the first memory cell; and
a determining unit configured to compare a number of clock pulses of the pumping clock signal with a predetermined critical value during performance of the MSB program operation, and to output a program stopping signal when the number of pulses of the pumping clock signal is greater than the predetermined critical value to stop the performance of the MSB program operation.

19. The nonvolatile memory chip of claim 18, wherein the determining unit is further configured to output a program continuation signal when the number of pulses of the pumping clock signal is less than the predetermined critical value to continue the performance of the MSB program operation.

20. The nonvolatile memory device of claim 19, wherein the determining unit comprises:
a counter configured to count the number of pulses of the pumping clock signal; and
a comparator configured to compare the number of pulses output by the counter with the predetermined critical value, and to output one of the program stopping signal and the program continuation signal as a result of the comparison.

* * * * *